United States Patent [19]

Harper et al.

[11] 4,419,203

[45] Dec. 6, 1983

[54] APPARATUS AND METHOD FOR NEUTRALIZING ION BEAMS

[75] Inventors: James M. E. Harper; Mordehai Heiblum, both of Yorktown Heights, N.Y.; Harold R. Kaufman, Fort Collins, Colo.

[73] Assignee: International Business Machines Corporation, Armonk, N.Y.

[21] Appl. No.: 355,067

[22] Filed: Mar. 5, 1982

[51] Int. Cl.³ .............................................. C23C 15/00
[52] U.S. Cl. .............................. 204/192 R; 204/192 E; 204/298; 250/492.3
[58] Field of Search ................. 250/492.3; 204/192 R, 204/192 E, 298

[56] References Cited

U.S. PATENT DOCUMENTS

| | | | |
|---|---|---|---|
| 3,050,652 | 8/1962 | Baldwin | 313/63 |
| 3,156,090 | 11/1964 | Kaufman | 60/35.5 |
| 3,354,644 | 11/1967 | Moore | 60/202 |
| 3,408,283 | 10/1968 | Chopra | 204/298 |
| 3,515,932 | 6/1970 | King | 313/79 |
| 3,523,211 | 8/1970 | Oishi et al. | 315/209 |
| 3,697,793 | 10/1972 | King | 313/63 |
| 3,913,320 | 10/1975 | Reader et al. | 60/202 |
| 3,956,666 | 5/1976 | Reader et al. | 315/111.8 |
| 4,088,926 | 5/1978 | Fletcher | 315/111.2 |
| 4,101,772 | 7/1978 | Konishi et al. | 204/192 E |
| 4,131,506 | 12/1978 | Namga et al. | 204/192 E |
| 4,151,589 | 6/1979 | Keller et al. | 204/192 E |
| 4,172,020 | 10/1979 | Tisone | 204/298 |
| 4,201,654 | 5/1980 | Castleman | 204/192 E |
| 4,250,009 | 2/1981 | Cuomo et al. | 204/298 |
| 4,264,813 | 4/1981 | Chandrashekhar | 204/192 E |
| 4,309,267 | 1/1982 | Boyd et al. | 204/192 E |
| 4,313,791 | 2/1982 | Taillet | 204/192 E |
| 4,349,409 | 9/1982 | Shibayama et al. | 204/192 E |

OTHER PUBLICATIONS

Geis et al., J. Vac. Sci. Technol., 19(4), 1981, pp. 1390–1393.

Primary Examiner—Arthur P. Demers
Attorney, Agent, or Firm—Pollock, Vande Sande & Priddy

[57] ABSTRACT

Apparatus is described for neutralizing high intensity ion beams. A technique for neutralizing a positive ion beam from internally plasma produced electrons is provided whereby electrons are added to the positive ion beam by maintaining the voltage between the cathode, anode, and accelerator grid in a predetermined relationship. Other higher energy ion beams are neutralized in another technique by directing the neutralizing beam of charged particles to intersect a sputtering beam.

8 Claims, 4 Drawing Figures

APPARATUS AND METHOD FOR NEUTRALIZING ION BEAMS

DESCRIPTION

Technical Field p The present invention relates to ion generation for use in sputtering systems for working a substrate surface. In particular, method and apparatus are provided for neutralizing ion beams.

Background Art

Sputtering techniques for precisely machining the surface of a target substrate are well known. These techniques require the generation of an ion beam at a sufficient energy level to remove atomic particles from a target surface of the substrate by bombardment with the ion beam. The sputtered particles may themselves be deposited through suitable masking to a second substrate to form a precise deposition layer for an electronic component.

The efficiency of sputtering systems of the prior art is limited when bombarding substrates which are insulators because of an electric charge which develops on the surface of the target area. The charge is reduced by adding to the incident ion beam free electrons, in the case of a positive ion sputtering beam, or positive ions in the case of a negative ion sputtering beam.

In the case of a positive ion beam, free electrons have been added to the positive ion beam by means of a separate emitter, in the path of the ion beam, usually a filament carrying an electrical current. This technique of neutralizing the beam adds free electrons to the ion beam neutralizing the charge at the substrate surface.

Several disadvantages are encountered when using the filament neutralizing technique, the first of which is contamination of the substrate. It is not unusual for the filament to evaporate or sublimate whereby contaminants are added to the ion beam.

Placing the filament in the ion beam also causes the substrate to be heated which in the case of some substrates causes degradation of the substrate surface. Additionally, the filament is subject to bombardment by the incident ion beam thereby sputtering filament particles into the ion beam which end up on the substrate.

One prior art technique of producing a neutralized beam is described in U.S. Pat. Nos. 3,523,210 and 3,515,932. This neutralizer requires that a certain beam current level be established to maintain a bridge of plasma for adding neutralizing electrons to the ion stream. Thus, neutralization is dependent on a current intensity sufficient to form a plasma bridge wherein a portion of the plasma exits the plasma generator to enter the ion stream. Low current beam production cannot therefore make use of this technique because of the current requirements necessary with plasma bridge neutralization. The plasma bridge neutralization technique generates a plume of ions and electrons resulting in a poorly directed beam incapable of being aimed at a distant target.

Summary of Invention

It is an object of the present invention to provide neutralization for an ion beam used in sputtering and materials modification processes.

It is a more particular object of the invention to provide for neutralization of an ion beam without adding significant contamination particles to the ion beam.

These and other objects are provided by methods and apparatus in accordance with the present invention. The addition of charged particles to the ion beam of a sputtering system is provided without adding significant contaminating particles to the sputtering beam and without heating the sputtered substrate.

In one embodiment of the invention, neutralization of a positive ion beam is accomplished internal to an ion generator. A plasma is ionized with an electrical current passing between a cathode and anode immersed in a gas atmosphere. The electron current through the gas produces positive ions and secondary electrons. A screen grid forms an exit aperture for the ions and electrons. The screen grid is maintained at a voltage marginally positive with respect to the cathode permitting an equal number of positive ions and neutralizing electrons to be accelerated into a collimated positive ion beam.

In yet another embodiment of the invention, a sputtering beam is neutralized by a secondary low energy ion beam which intersects the sputtering beam. The secondary beam contains particles having the appropriate charge for neutralizing the sputtering beam, positive ions in the case of a negative ion sputtering beam, and free electrons in the case of a positive ion sputtering beam. The low energy beam provides for minimum interaction with the sputtering beam and surrounding vacuum facility.

BEST MODE FOR CARRYING OUT THE INVENTION

Figure 1:
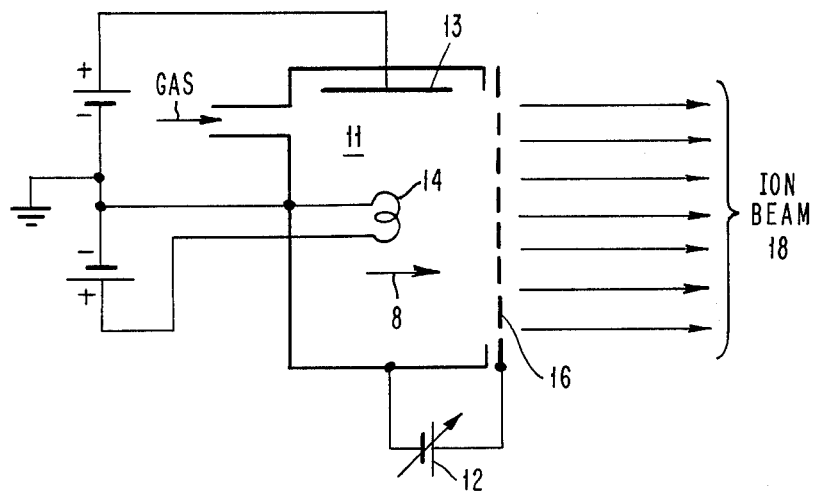
FIG. 1 shows an apparatus of one embodiment of the invention for providing a self-neutralized beam.

Referring now to FIG. 1, there is shown an ion source comprising a chamber 11 for receiving a gas to be ionized. The gas may be typically argon with a chamber pressure of 1m torr.

A magnetic field 8 is established across the chamber 11 which, as is known to those skilled in the art, increases the ion producing efficiency of chamber 11. A filament 14 is connected to a source of electric potential and thereby emits electrons. An anode 13 is maintained at a potential for attracting the electrons.

Figure 3:
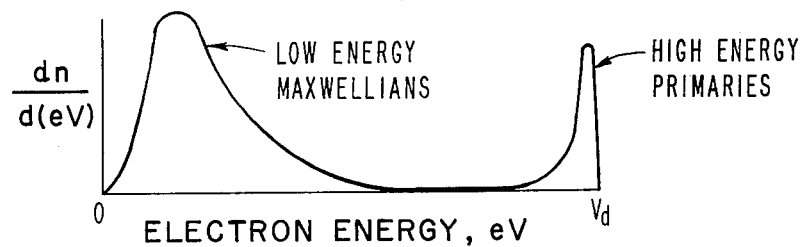
FIG. 3 illustrates the energy distribution of electrons in the chamber 10 of FIG. 1.

The migrating electrons have an energy level distribution as shown in FIG. 3. The first major electron population has a low energy Maxwellian distribution. The second major electron population comprises a group of high energy primary electrons. The electrons which migrate within the chamber 11 collide with gas atoms producing both positive ions and low energy electrons. A plasma forms having a voltage potential several volts positive of the anode.

A grid 16 having a plurality of apertures 16a is maintained at a potential for accelerating the positive ions in the plasma through the apertures to the exterior of the chamber 11. A sheath forms between the plasma and grid as a boundary for the plasma due to the potential on screen grid 16.

Figure 2:
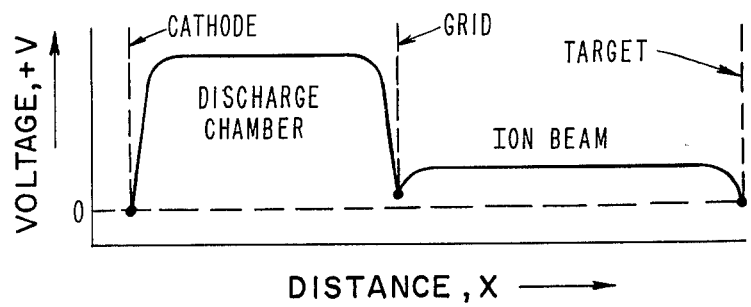
FIG. 2 illustrates the voltage potential distribution within chamber 11 of FIG. 1.

The apparatus of FIG. 1 is capable of supplying to the positive ion beam negative electrons for neutralizing the beam. To make use of the electrons within the plasma as neutralizing particles, the grid 16 is maintained at a voltage potential slightly positive of the cathode 14 within the chamber 11. The voltage potential within the chamber 11 for this condition is shown in FIG. 2. The cathode 14 potential is established to be zero volts. The anode is held at a voltage of 40 volts positive of the cathode. The plasma assumes a positive voltage potential with respect to the cathode, and a voltage gradient exists between the plasma, cathode 14 and grid 16 forming a sheath for the plasma.

The single screen grid 16 is maintained at a slightly positive voltage, typically 1–5 volts, with respect to the cathode 14. The advantage of maintaining a voltage potential distribution within the chamber 11 as shown in FIG. 2 is the introduction of free electrons into the positive ion beam 18 formed at screen grid 16. The positive voltage on the single screen grid 16 permits high energy primary electrons of FIG. 3 to migrate towards the grid. These primary electrons balance the charge provided by the ions exiting the screen grid 16.

The high energy primary electrons in the plasma which exit through grid 16 have dissipated much of their kinetic energy in passing over the grid 16 and have an energy level desirable for neutralization.

The grid 16 potential is maintained at a desirable level for promoting a positive ion, self neutralized beam by either allowing the grid to float and assume a voltage potential established by the collision of electrons and ions on the grid, or by using a power supply 12 connected between the grid 16 and the chamber 11 as shown in FIG. 1.

To further reduce the possible contamination of the generated ion stream, the cathode 14 is located at a position within the chamber 11 so that no line of sight path exists between the target irradiated with the ion beam and the cathode 14. This apparatus for generating a self neutralized beam is particularly useful in low energy ion beam formation having an energy of less than 100 ev.

The ion source of FIG. 1, being self neutralized, is useful for neutralizing other, higher intensity ion beams will now be described in reference to FIG. 4.

Figure 4:
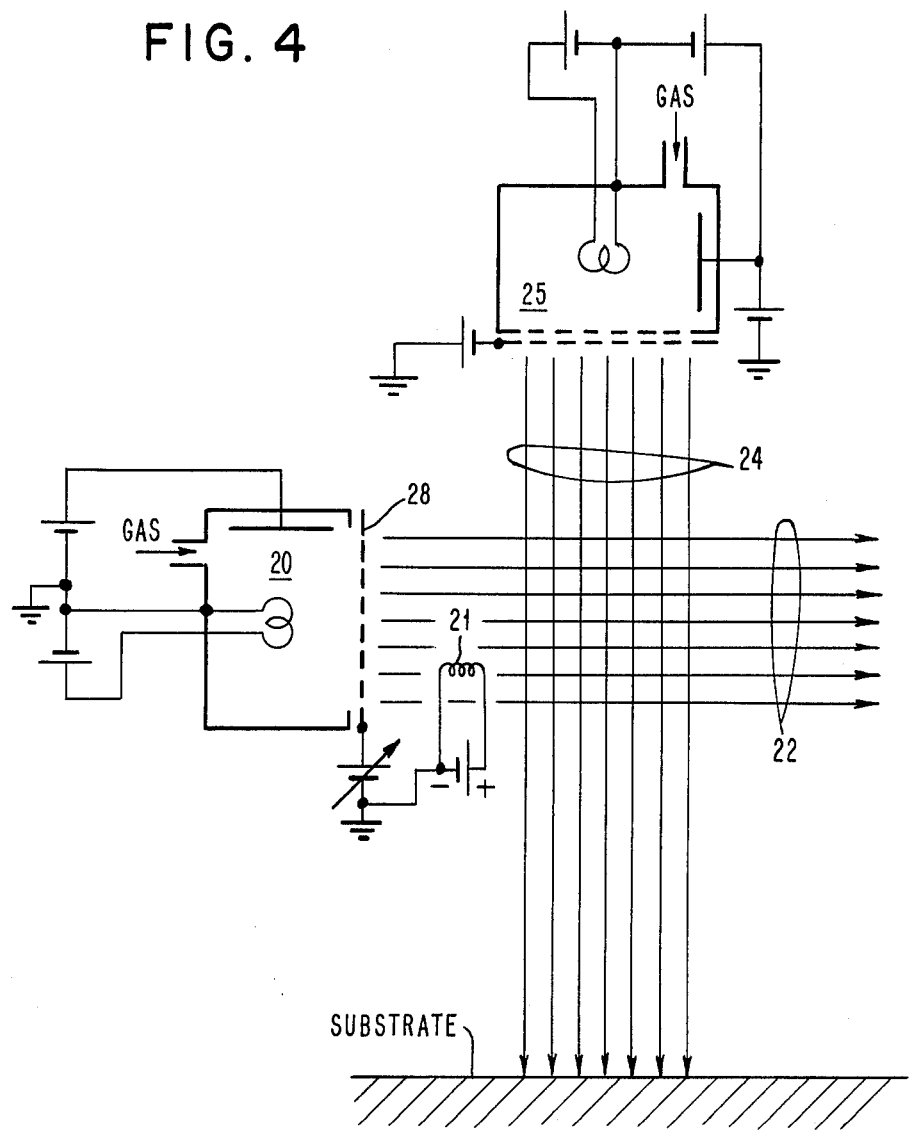
FIG. 4 illustrates yet another technique for neutralizing an ion beam using a secondary, neutralized ion beam.

Referring now to FIG. 4, there is shown yet another technique for neutralizing an ion beam. A secondary, low energy beam 22 is directed towards a primary sputtering beam 24. The arrangement of FIG. 4 is useful for neutralizing both positive ion beams and negative ion beams. The primary sputtering beam is generated by a multi-grid, high energy ion accelerator 25.

The arrangement of FIG. 4 does not require the particular ion source of FIG. 1 to generate the secondary beam. The use of a refractory metal filament 21 external to the ion source 20 will provide free electrons which will neutralize both the secondary and primary ion beams 22, 24 generated by ion sources 20 and 25. The filament 21 can be located at least 10 cm from the main beam so that heating of the substrate can be minimized. In either type of secondary low energy beam generation, self-neutralized or externally neutralized, the single grid 28 ion source is contemplated for providing an adequate secondary ion beam. The single grid accelerator is used also in those applications where a positive ion beam neutralizes a negative ion beam. In a negative ion beam, positive ions from a secondary beam eventually appear as randomized thermal energy.

The neutralization capability of this secondary ion beam is demonstrated considering the following example. Assuming that a secondary, 30 ev argon beam of positive ions is used to carry electrons for neutralizing both beams, having a radius of 1 cm and a current density of 1 ma/cm$^2$, the ion velocity can be determined as:

$$V_1 = 1.389 \times 10^4 [E(\text{ev})/M_i(\text{amu})]^{\frac{1}{2}}$$
$$= 1.389 \times 10^4 [30/40]^{\frac{1}{2}}$$
$$= 1.20 \times 10^4 \text{ m/S}$$

The ion and electron density is $$n = J^i/qV_1 = 10/1.602 \times 10^{-19} \times 1.20 \times 10^4 = 5.2 \times 10^{15} M^{-3},$$

where $J^i$ is the current density, and q is the charge of an electron. The saturation electron current through the beam is calculated as follows.

$J^s = nqvA/4$, where

A = beam cross sectional area, and
v = mean electron velocity.

For an average neutralizer, the electron temperature would be expected to be 1–2 ev, producing mean electron velocities of $6.69 \times 10^5$ m/s to $9.46 \times 10^5$ m/s. This produces a saturation current $J^s$ of between 44 ma and 62 ma when applied as above.

Thus, the 30 ev argon beam is capable of producing a saturation electron current within 44–62 ma. The electron current can in accordance with the above calculation be increased with a higher electron temperature or by increasing the cross section area of the beam.

The potential drop across the secondary beam over a 10 cm length should not significantly affect the electron current capacity of the second beam. Considering a typical plasma resistivity for electron energies of 1–2 ev, the resistance of a 10 cm length of the secondary beam should be between 0.20 ohms and 0.08 ohms thereby providing a voltage drop of 9 mv and 5 mv respectively. This should only minimally affect the electron current carrying capability of the beam.

Thus, there is described a technique for producing an internally neutralized low energy ion beam capable of neutralizing a higher energy ion beam. Those skilled in the art will recognize other embodiments of the invention described more particularly by the claims which follow.

Technical Improvement

An improved apparatus and method of neutralizing ion beams used in sputtering and materials modification processes minimizing contamination of the sputtering beam, and minimizing heating of the substrate being etched is provided.

Having thus described my invention, what I claim as new, and desire to secure by Letters Patent is:

1. An apparatus for generating a self-neutralized ion beam comprising:
   a plasma chamber for receiving a gas for producing ions, said chamber including anode and cathode elements, and an acceleration screen grid for supplying charged particles, said cathode and anode producing in response to a voltage potential energetic primary electrons and low energy background electrons for ionizing said gas;
   means for applying a voltage potential between said cathode and anode whereby said energetic primary electrons and low energy background electrons are produced; and means for maintaining said screen grid at a marginally positive voltage potential with respect to said cathode, and at a larger negative voltage with respect to said anode whereby said high energy electrons migrate to said grid along with ions produced by collisions of said electrons and gas, and exit said grid forming a neutralized ion beam.

2. The apparatus of claim 1 wherein said cathode is located within said chamber at a position to minimize contamination of said ion beam.

3. The apparatus of claim 1 wherein said grid potential is between 1 and 5 volts positive of said cathode.

4. A method for generating a neutralized ion beam comprising:

generating a plasma with an electrical current passing between an anode and cathode in a gas filled chamber whereby positive ions are produced, along with high energy primary electrons and low energy background electrons;

accelerating said positive ions away from said plasma through a screen grid by establishing a voltage potential between said screen grid and said plasma which accelerates high energy primary electrons with said positive ions flow through said screen.

5. A method for generating a neutralized ion beam according to claim 4, wherein said screen grid is maintained at a voltage potential of 1–5 volts positive of said cathode.

6. In a system wherein an ion beam is directed against a sputtering substrate, a method for neutralizing said ion beam comprising:

generating a low energy ion beam having an energy level less than said sputtering substrate sputtering threshold from a plasma generator having a cathode, anode and a single screen grid, said screen grid being maintained at a voltage potential marginally positive with respect to said cathode and at a larger negative potential with respect to said anode, whereby said low energy beam includes a high population density of free electrons; and directing said low energy ion beam to intersect said sputtering ion beam whereby said free electrons are available to neutralize said sputtering ion beam.

7. A system for sputtering a target substrate with a neutralized negative ion beam, comprising:

means for generating a negative ion beam;

means for generating from a plasma a low energy positive ion beam; and means for directing said positive ion beam transversely across said negative ion beam whereby said negative ion beam is neutralized.

8. In a system for sputtering a target substrate including a sputtering beam generator for generating a high intensity sputtering beam, a method for neutralizing said beam comprising generating from a plasma a low energy positive ion beam; and directing said positive ion beam transversely across said high intensity sputtering beam whereby said negative ion beam is neutralized.

* * * * *